(12) United States Patent
Liu et al.

(10) Patent No.: US 10,662,352 B2
(45) Date of Patent: May 26, 2020

(54) ADHESIVE COMPOSITION AND USES OF THE SAME

(71) Applicant: TAIWAN UNION TECHNOLOGY CORPORATION, Chupei (TW)

(72) Inventors: Shur-fen Liu, Chupei (TW); Chin-Hsien Hung, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 112 days.

(21) Appl. No.: 15/956,976

(22) Filed: Apr. 19, 2018

(65) Prior Publication Data

US 2019/0194505 A1    Jun. 27, 2019

(30) Foreign Application Priority Data

Dec. 27, 2017    (TW) .............................. 106146007 A

(51) Int. Cl.
*C09J 123/36*    (2006.01)
*C09J 123/26*    (2006.01)
(Continued)

(52) U.S. Cl.
CPC .............. *C09J 123/36* (2013.01); *B32B 3/30* (2013.01); *B32B 5/02* (2013.01); *B32B 7/12* (2013.01); *B32B 15/20* (2013.01); *C09J 123/0823* (2013.01); *C09J 123/26* (2013.01); *H05K 1/0366* (2013.01); *H05K 3/022* (2013.01); *H05K 3/386* (2013.01); *B32B 2250/02* (2013.01); *B32B 2260/046* (2013.01); *B32B 2307/202* (2013.01);
(Continued)

(58) Field of Classification Search
CPC .. C09J 123/36; C09J 123/0823; C09J 123/26; B32B 3/30; B32B 5/02; B32B 7/12; B32B 15/20; H05K 1/0366; H05K 3/022; H05K 3/386
USPC ......................................................... 525/55
See application file for complete search history.

(56) References Cited

U.S. PATENT DOCUMENTS 6,132,861 A    10/2000    Poutasse
7,648,770 B2    1/2010    Tanaka
(Continued)

FOREIGN PATENT DOCUMENTS

JP    05320268 A    * 12/1993
JP    2015067822 A    *  4/2015
(Continued)

*Primary Examiner* — Kelechi C Egwim
(74) *Attorney, Agent, or Firm* — Greer, Burns & Crain, Ltd.

(57) ABSTRACT

An adhesive composition is provided including the following components:
(A) an unsaturated monomer; and
(B) an olefin copolymer comprising the following repeating units:
(B-1) a repeating unit of formula (I),

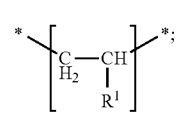

formula (I)

(B-2) a repeating unit of formula (II),

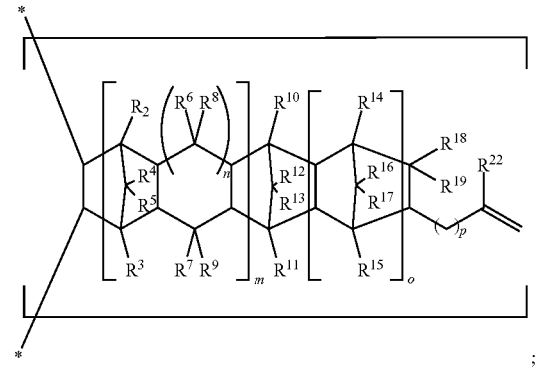

formula (II)

and
(B-3) a repeating unit of formula (III),

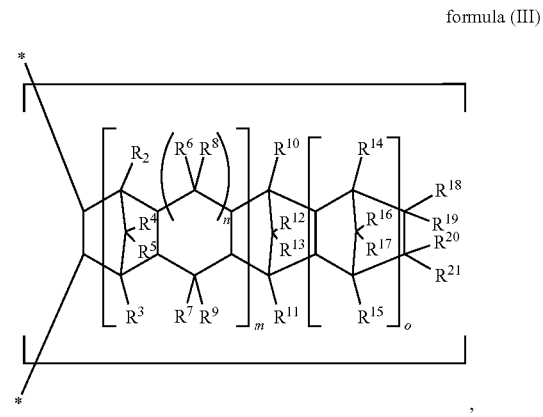

formula (III)

$R^1$ to $R^{21}$, m, n, o, and p in formulas (I) to (III) are as defined in the specification,
(Continued)

wherein based on the total moles of the repeating units (B-1), (B-2) and (B-3), the amount of the repeating unit (B-2) ranges from 19 mol % to 36 mol %; and wherein the weight ratio of the olefin copolymer (B) to the unsaturated monomer (A) ranges from 2 to 20.

20 Claims, 2 Drawing Sheets

(51) Int. Cl.
  *B32B 3/30* (2006.01)
  *B32B 5/02* (2006.01)
  *B32B 7/12* (2006.01)
  *B32B 15/20* (2006.01)
  *H05K 3/02* (2006.01)
  *H05K 1/03* (2006.01)
  *H05K 3/38* (2006.01)
  *C09J 123/08* (2006.01)
  *H05K 1/09* (2006.01)

(52) U.S. Cl.
  CPC ..... *B32B 2307/204* (2013.01); *B32B 2457/08* (2013.01); *C08L 2312/08* (2013.01); *H05K 1/09* (2013.01); *H05K 2201/012* (2013.01); *H05K 2201/0158* (2013.01)

(56) References Cited

U.S. PATENT DOCUMENTS

| | | | |
|---|---|---|---|
| 8,519,273 | B2 | 8/2013 | Paul |
| 9,206,278 | B2 | 12/2015 | Yoshida |
| 2014/0151091 | A1 | 6/2014 | Fujimoto |
| 2017/0188457 | A1 | 6/2017 | Matsuura |

FOREIGN PATENT DOCUMENTS

| | | | |
|---|---|---|---|
| JP | 2016017089 A | * | 2/2016 |
| WO | 2017150218 A1 | | 9/2017 |

* cited by examiner

ADHESIVE COMPOSITION AND USES OF THE SAME

CLAIM FOR PRIORITY

This application claims the benefit of Taiwan Patent Application No. 106146007 filed on Dec. 27, 2017, the subject matters of which are incorporated herein in their entirety by reference.

BACKGROUND

Field of the Invention

The present invention provides an adhesive composition, especially an adhesive composition comprising a specific olefin copolymer. The present invention also provides a laminate comprising an adhesive layer prepared from the adhesive composition and a method for preparing the same as well as a printed circuit board prepared by using the laminate. The adhesive composition of the present invention can increase the adhesion strength between the laminate's conductive layer and dielectric layer and is therefore particularly suitable for the preparation of a laminate using a non-profile (NP) metal foil as a conductive layer.

Descriptions of the Related Art

A printed circuit board (PCB) is used as a substrate of an electronic device for carrying various electronic components that are electrically connected with each other to provide a stable circuit working environment. The printed circuit board is basically manufactured from a laminate which is formed of alternating laminated conductive layers and dielectric layers. Generally, the printed circuit board can be prepared by the following method.

First, a reinforcing material (e.g., a glass-fiber fabrics) is impregnated into a resin (e.g., an epoxy resin). The resin-impregnated reinforcing material is cured to a semi-cured state (known as B-stage) to obtain a prepreg as a dielectric layer. Afterwards, a predetermined number of dielectric layers (i.e., prepregs) are superimposed, and a conductive layer (e.g., a metal foil) is superimposed on at least one external surface of the superimposed dielectric layers to provide a superimposed object. Then, the superimposed object is subject to a hot-pressing operation (known as C-stage) to obtain a laminate. The conductive layer of the laminate is etched to form a predetermined circuit pattern. Finally, the etched laminate is subjected to a drilling process to form a plurality of holes thereon, and a conductive material is plated on such holes to form via holes, thereby, obtaining the printed circuit board.

Due to the miniaturization of electronic devices, the printed circuit board is required to be thinner and denser and must meet high-frequency and high-speed transmission requirements. To make the printed circuit board thinner and realize high-frequency and high-speed transmission, a metal foil with low roughness is usually used as the conductive layer of the printed circuit board to minimize the required space for the printed circuit board and improve the electrical properties of the printed circuit board. However, the poor adhesion strength between the conductive layer with low roughness and the dielectric layer of printed circuit board makes the reliability of the printed circuit board deteriorate.

Regarding the aforementioned poor adhesion strength problem between the conductive layer with low roughness and the dielectric layer, U.S. Pat. No. 6,132,851 A discloses an adhesive composition for copper foils. The adhesive composition comprises at least one phenolic resole resin and a product made by reacting at least one di-functional epoxy resin with at least one compound represented by

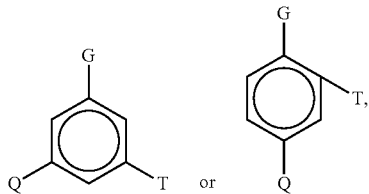

wherein G, T, and Q are each independently —COOH, —OH, —SH, —NH$_2$, and the like. The forgoing adhesive composition can improve the binding strength between the conductive layer and dielectric layer as well as the heat resistance of the laminate. U.S. Pat. No. 7,648,770 B2 discloses a resin primer containing a resin, wherein the resin comprises a polyamideimide with a siloxane structure in the main chain, so that the resin primer can provide better adhesion strength between a conductor foil and an insulating layer. U.S. Pat. No. 8,519,273 B2 discloses a circuit subassembly comprising a conductive layer, a dielectric layer, and an adhesive layer comprising poly(arylene ether) between the conductive layer and the dielectric layer, wherein the adhesive layer is used to improve the adhesion strength between the conductive layer and the circuit substrate and the flame retardance of the circuit subassembly. TW 1528873 B discloses a primer layer for a plating process. The primer layer contains a poly-functional epoxy resin, an epoxy resin curing agent, and a polybutadiene-modified polyamide resin containing a phenolic hydroxyl group. The primer layer has a strong adhesiveness to an electroless copper plating and satisfies the high density wiring requirement of semiconductor packaging. Furthermore, the primer layer has a satisfactory solder heat resistance for a lead-free soldering process.

However, none of the aforementioned technical solutions can effectively solve the indicated adhesion strength problem between the low roughness conductive layer and the dielectric layer.

SUMMARY

In view of the aforementioned technical problems, the present invention provides an adhesive composition, which can be used to adhere a dielectric layer and a conductive layer of a laminate to enhance the adhesion strength therebetween, thereby improving the room temperature (i.e., ordinary temperature) peel strength and heat resistant peel strength of the laminate without adversely affecting the electrical properties and physicochemical properties of the laminate. Thus, the adhesive composition of the present invention is especially suitable for preparing a laminate that uses a low roughness metal foil or an extremely-low roughness metal foil as a conductive layer.

As illustrated in the following objectives, the technical means of the present invention is to use an unsaturated monomer in combination with a specific olefin copolymer with a certain ratio, so that an adhesive layer formed by the adhesive composition of the present invention can be provided with the aforementioned advantages and is useful in preparing a printed circuit board which uses a low roughness metal foil as a conductive layer to lower its thickness and realize high-frequency and high-speed transmission.

An objective of the present invention is to provide an adhesive composition, which comprises the following constituents:

(A) an unsaturated monomer; and
(B) an olefin copolymer comprising the following repeating units:

(B-1) a repeating unit of formula (I),

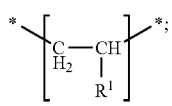

formula (I)

(B-2) a repeating unit of formula (II),

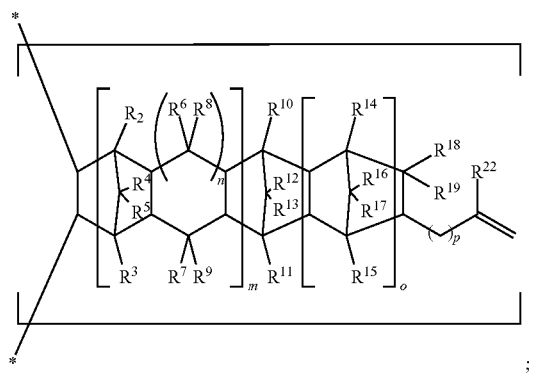

formula (II)

and
(B-3) a repeating unit of formula (III),

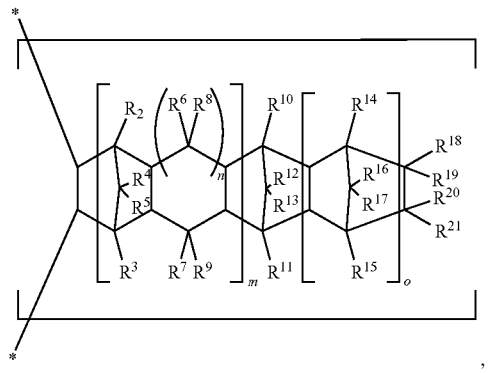

formula (III)

in formulas (I) to (III),
$R^1$ is H or a $C_1$ to $C_{29}$ linear or branched hydrocarbon group, and preferably H or a $C_1$ to $C_{29}$ alkyl;
$R^2$ to $R^{21}$ are independently H, halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aryl, and $R^{18}$ to $R^{21}$ may form a monocyclic ring or polycyclic ring by binding to each other;
$R^{22}$ is H or a $C_1$ to $C_{10}$ alkyl;
m and n are independently 0 or 1;
o is 0 or a positive integer;
p is an integer of 0 to 10; and
in formula (III), when both m and n are 0, at least one of $R^{10}$ to $R^{13}$ and $R^{18}$ to $R^{21}$ is not H, wherein based on the total moles of the repeating units (B-1), (B-2) and (B-3), the content of the repeating unit (B-2) is about 19 mol % to 36 mol %, and preferably about 20 mol % to 33 mol %; and wherein the weight ratio of the olefin copolymer (B) to the unsaturated monomer (A) is about 2 to 20, and preferably about 3.3 to 15.

In some embodiments of the present invention, the unsaturated monomer (A) is selected from the group consisting of vinyl-containing aromatic monomers, allyl-containing monomers, acryloyl-containing monomers, vinyl ethers, maleimide compounds, and combinations thereof.

In some embodiments of the present invention, the allyl-containing monomer is selected from the group consisting of diallyl phthalate, diallyl isophthalate, triallyl mellitate, triallyl mesate, triallyl benzene, triallyl cyanurate, triallyl isocyanurate, triallyl amine, and combinations thereof.

In some embodiments of the present invention, the repeating unit (B-2) is derived from one or more cyclic non-conjugated diene monomers through an addition copolymerization, wherein the one or more cyclic non-conjugated diene monomers are selected from the group consisting of

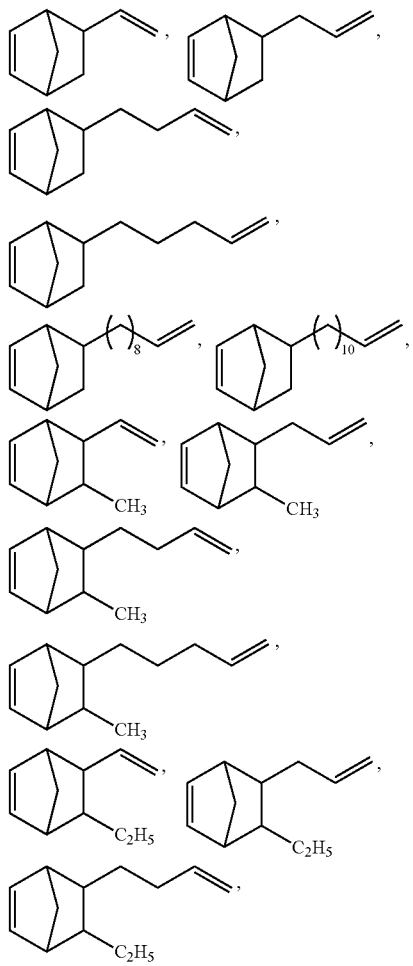

-continued

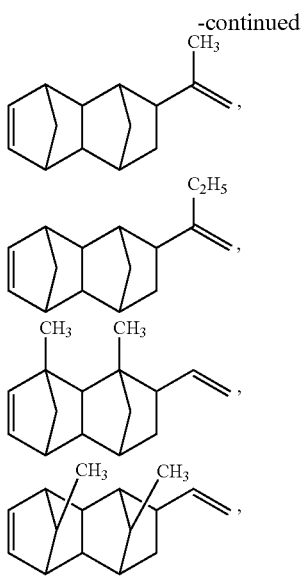

and combinations thereof.

In some embodiments of the present invention, the adhesive composition further comprises a silane coupling agent (C). The silane coupling agent (C) is selected from the group consisting of N-(2-aminoethyl)-3-aminopropyl trimethoxy silane, N-phenyl-3-aminopropyl trimethoxy silane, vinyl trimethoxy silane, 3-mercaptopropyl methyl dimethoxy silane, 3-mercaptopropyl trimethoxy silane, and combinations thereof.

In some embodiments of the present invention, based on 100 parts by weight of the adhesive composition, the amount of the silane coupling agent (C) is about 0.1 parts by weight to 2 parts by weight.

Another objective of the present invention is to provide a laminate, which comprises:
a conductive layer;
a dielectric layer; and
an adhesive layer disposed between the conductive layer and the dielectric layer for adhering the conductive layer to the dielectric layer,
wherein the adhesive layer is prepared from the aforementioned adhesive composition.

In some embodiments of the present invention, the weight of the adhesive layer is about 2 g/m² to 18 g/m².

In some embodiments of the present invention, the conductive layer is a copper foil, and the roughness (Rz) of the copper foil is preferably 2 μm or less.

In some embodiments of the present invention, the dielectric layer is prepared from one or more prepregs, wherein the one or more prepregs each comprises a curable resin and a reinforcing material.

In some embodiments of the present invention, the curable resin is selected from the group consisting of polyphenylene ether resins, epoxy resins, phenolic resins, polyformaldehyde resins, silicones, polytetrafluoroethylene, and combinations thereof.

In some embodiments of the present invention, the dielectric layer is prepared from one or more curable resins selected from the group consisting of polyphenylene ether resins, epoxy resins, phenolic resins, polyformaldehyde resins, silicones, polytetrafluoroethylene, and combinations thereof. It is preferable that the dielectric layer is prepared from a curable resin comprising a polyphenylene ether resin.

Yet another objective of the present invention is to provide a method of preparing a laminate, which comprises the following steps:
providing a conductive layer and a dielectric layer; and
providing an adhesive layer between the conductive layer and the dielectric layer for adhering the conductive layer to the dielectric layer,
wherein the adhesive layer is prepared from the aforementioned adhesive composition.

Still another objective of the present invention is to provide a printed circuit board, which is prepared from the aforementioned laminate.

To render the above objectives, technical features and advantages of the present invention more apparent, the present invention will be described in detail with reference to some embodiments hereinafter.

DETAILED DESCRIPTION

Figure 1:
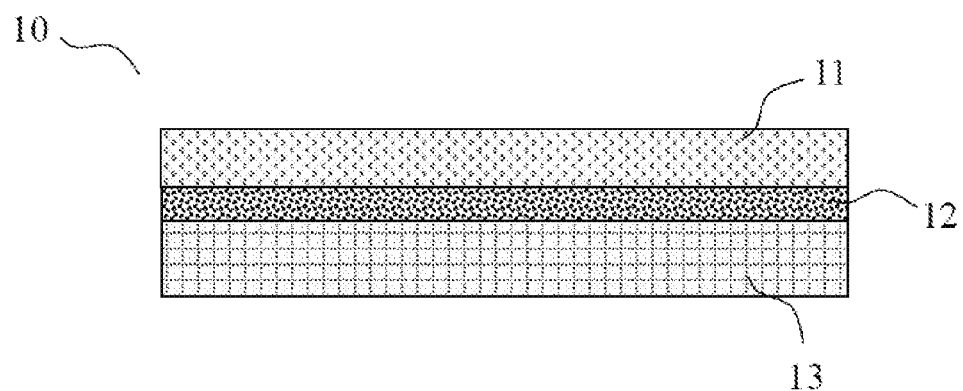
FIG. 1 is a schematic diagram showing an embodiment of the laminate of the present invention.

Hereinafter, some embodiments of the present invention will be described in detail. However, without departing from the spirit of the present invention, the present invention may be embodied in various embodiments and should not be limited to the embodiments described in the specification.

In the appended drawings, similar components are represented by similar numeral references. For clarity, the thickness of each layer and each area may be exaggerated. When a layer is illustrated to be "on" another layer or substrate, the layer can be directly on the other layer or substrate, or an intervening layer may be presented.

Although terms such as "first", "second", and "third" may be used herein to describe various components, assemblies, areas, layers, and/or sections, such components, assemblies, areas, layers, or sections are not to be limited by those terms. Rather, these terms are only used to distinguish one component, assembly, area, layer, or section from another component, assembly, area, layer, or section.

Unless it is additionally explained, the expressions "a," "the," or the like recited in the specification (especially in the claims) should include both the singular and the plural forms.

Unless it is additionally explained, while describing the constituents in the solution, mixture and composition in the specification, the amount of each constituent is calculated based on the dry weight, i.e., regardless of the weight of the solvent.

As used herein, the term "about" in quantitative terms refers to plus or minus an amount that is general and reasonable to persons skilled in the art.

As used herein, the term "curable resin" not only refers to the listed curable resin itself, but also refers to a resin composition comprising the curable resin and other conventional constituents.

The adhesive composition of the present invention uses an unsaturated monomer in combination with a specific olefin copolymer with a certain ratio. When the unsaturated monomer and the specific olefin copolymer are used in the certain ratio, they can react to an ideal condition, such that a laminate prepared by using the adhesive composition can be provided with outstanding room temperature peel strength and heat resistant peel strength without affecting its electrical properties and physicochemical properties. Therefore, the adhesive composition of the present invention is particularly useful in preparing a printed circuit board that uses a low roughness metal foil as a conductive layer to lower its thickness and realize high-frequency and high-speed transmission. The technical features and effects related to the present invention are described below based on some embodiments.

1. Adhesive Composition

The adhesive composition of the present invention comprises an unsaturated monomer (A) and an olefin copolymer (B) as essential constituents, and other optional constituents. The detailed descriptions for each constituents are provided below.

1.1. Unsaturated Monomer (A)

In the adhesive composition of the present invention, the unsaturated monomer (A) refers to a polymerizable monomer that contains carbon-carbon double bond(s) and can react with other unsaturated olefins. Examples of the unsaturated monomer include but are not limited to vinyl-containing aromatic monomers, allyl-containing monomers, acryloyl-containing monomers, vinyl ethers, maleimide compounds, and combinations thereof. The detailed descriptions for the unsaturated monomer are provided below.

1.1.1. Vinyl-Containing Aromatic Monomer

The vinyl-containing aromatic monomer may be a monomer represented by the following formula (IV):

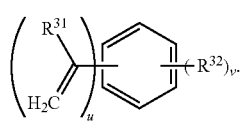

formula (IV)

In formula (IV), $R^{31}$ is independently H or a $C_1$ to $C_{18}$ hydrocarbon group; each of $R^{32}$ is independently H, a $C_1$ to $C_{12}$ alkyl, a $C_1$ to $C_{12}$ alkoxy, or a $C_6$ to $C_{18}$ aryl; u is 1 to 4; and v is 0 to 5. The $C_1$ to $C_{18}$ hydrocarbon group includes but is not limited to a $C_1$ to $C_{12}$ alkyl, a $C_2$ to $C_{12}$ alkenyl, a $C_2$ to $C_{12}$ alkynyl, and a $C_6$ to $C_{18}$ aryl. Examples of the $C_1$ to $C_{12}$ alkyl include but are not limited to methyl, ethyl, n-propyl, isopropyl, n-butyl, isobutyl, tert-butyl, n-pentyl, isopentyl, tert-pentyl, neopentyl, n-hexyl, isohexyl, n-heptyl, isoheptyl, n-octyl, isooctyl, n-nonyl, isononyl, n-decyl, isodecyl, undecyl, and dodecyl. Examples of the $C_2$ to $C_{12}$ alkenyl include but are not limited to vinyl, propenyl, allyl, n-butenyl, isobutenyl, pentenyl, hexenyl, heptenyl, octenyl, nonenyl, decenyl, butadienyl, pentadienyl, and hexadienyl. Examples of the $C_2$ to $C_{12}$ alkynyl include but are not limited to ethynyl, propynyl, butynyl, pentynyl, hexynyl, heptynyl, octynyl, nonynyl, and decynyl. Examples of the $C_1$ to $C_{12}$ alkoxy include but are not limited to methoxy, ethoxy, propoxy, butoxy, pentyloxy, and hexyloxy. Examples of the $C_6$ to $C_{18}$ aryl include but are not limited to phenyl, biphenyl, naphthyl, anthranyl, phenanthryl, indenyl, fluorenyl, and anthronyl.

Examples of the vinyl-containing monomer include but are not limited to styrene, divinylbenzene (DVB), diisopropenyl benzene, and combinations thereof. Examples of styrene include but are not limited to α-methyl styrene, 2-methyl styrene, 3-methyl styrene, 4-methyl styrene, 2-tert-butyl styrene, 3-tert-butyl styrene, 4-tert-butyl styrene, and a styrene containing 1 to 5 halogen substitutes on its benzene ring. Examples of divinylbenzene includes but are not limited to 1,3-divinylbenzene and 1,4-divinylbenzene. Examples of diisopropenyl benzene includes but are not limited to 1,3-diisopropenyl benzene and 1,4-diisopropenyl benzene. In the appended Examples, divinylbenzene (DVB) is used.

1.1.2. Allyl-Containing Monomer

The allyl-containing monomer is an organic compound that comprises at least one allyl ($-CH_2-CH=CH_2$), preferably at least two allyls, and more preferably at least three allyls. Examples of the allyl-containing monomer include but are not limited to diallyl phthalate, diallyl isophthalate, triallyl mellitate, triallyl mesate, triallyl benzene, triallyl cyanurate (TAC), triallyl isocyanurate (TAIC), triallyl amine, and combinations thereof. In the appended Examples, triallyl isocyanurate (TAIC) is used.

1.1.3. Acryloyl-Containing Monomer

The acryloyl-containing monomer is a compound that comprises at least one acryloyl moiety with the following structure.

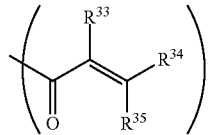

The acryloyl-containing monomer preferably comprises at least two, more preferably at least three of the acryloyl moieties. In the acryloyl moiety, $R^{33}$ to $R^{35}$ are independently H, a $C_1$ to $C_{12}$ hydrocarbon group, a $C_2$ to $C_{18}$ hydrocarbonoxy carbonyl, cyano ($-C\equiv N$), formyl ($-CHO$), carboxyl ($-C(=O)OH$), an imidate group ($-C(=NH)OH$), or a thiocarboxylic acid group ($-C(=O)SH$). The $C_1$ to $C_{12}$ hydrocarbon group includes but is not limited to a $C_1$ to $C_{12}$ alkyl, a $C_2$ to $C_{12}$ alkenyl, a $C_2$ to $C_{12}$ alkynyl, and a $C_6$ to $C_{12}$ aryl. Examples of the $C_1$ to $C_{12}$ alkyl, $C_2$ to $C_{12}$ alkenyl, $C_2$ to $C_{12}$ alkynyl, and $C_6$ to $C_{12}$ aryl are as described above and will not be repeated here. The $C_2$ to $C_{18}$ hydrocarbonoxy carbonyl includes but is not limited to a $C_2$ to $C_{12}$ alkoxy carbonyl and a $C_7$ to $C_{18}$ aryloxy carbonyl. Examples of the $C_2$ to $C_{12}$ alkoxy carbonyl include but are not limited to ethoxy carbonyl, propoxy carbonyl, butoxy carbonyl, pentyloxy carbonyl, hexyloxy carbonyl, heptyloxy carbonyl, octyloxy carbonyl, nonyloxy carbonyl, and decyloxy carbonyl. Examples of the $C_7$ to $C_{18}$ aryloxy carbonyl include but are not limited to phenoxy carbonyl and naphthyloxy.

Examples of the acryloyl-containing monomer include but are not limited to tris(hydroxymethyl)propane tri(meth) acrylate, 1,6-hexanediol di(meth)acrylate, neopentyl glycol di(meth)acrylate, ethylene glycol di(meth)acrylate, propylene glycol di(meth)acrylate, cyclohexane dimethanol di(meth)acrylate, tricyclodecane dimethanol di(meth)acrylate, butylene glycol di(meth)acrylate, diethylene glycol di(meth) acrylate, triethylene glycol di(meth)acrylate, isobornyl (meth)acrylate, methyl (meth)acrylate, methyl acryloyloxy propyl trimethoxy silane, ethoxylated (2) bisphenol A di(meth)acrylate, and mixtures thereof. The number which follows the term "ethoxylated" refers to the average number of ethoxy in the ethoxy compound chain that connects to each oxygen of bisphenol A. In the appended Examples, tricyclodecane dimethanol di(meth)acrylate is used.

1.1.4. Vinyl Ether

In the adhesive composition of the present invention, the vinyl ether is a compound that comprises at least one vinyl ether group (—O—CH=CH$_2$), preferably a compound that comprises at least two vinyl ether groups, and more preferably a compound that comprises at least three vinyl ether groups. Examples of the vinyl ether include but are not limited to 1,2-ethylene glycol divinyl ether, 1,3-propylene glycol divinyl ether, 1,4-butylene glycol divinyl ether, triethylene glycol divinyl ether, 1,4-cyclohexane dimethanol divinyl ether, ethyl vinyl ether, n-butyl vinyl ether, dodecyl vinyl ether, and 2-chloroethyl vinyl ether. The aforementioned compounds can be used either alone or in combination of two or more.

1.1.5. Maleimide Compound

The maleimide compound is a compound that comprises at least one maleimide group represented by the following structure.

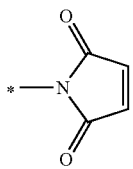

The maleimide compound preferably comprises at least two, more preferably at least three maleimide groups. Examples of the maleimide compound include but are not limited to N-phenyl maleimide, 1,4-phenylene-bismethyl-α,α'-bismaleimide, 2,2-bis(4-phenoxyphenyl)-N,N'-bismaleimide, N,N'-phenylene bismaleimide, N,N'-hexamethylene bismaleimide, N,N'-biphenyl methane bismaleimide, N,N'-oxy-di-p-phenylene bismaleimide, N,N'-4,4'-benzophenone bismaleimide, N,N'-p-biphenyl sulfone bismaleimide, N,N'-(3,3'-dimethyl)methylene-di-p-phenylene bismaleimide, poly(phenyl methylene)polymaleimide, bis(4-phenoxyphenyl) sulfone-N,N'-bismaleimide, 1,4-bis(4-phenoxy)benzene-N,N'-bismaleimide, 1,3-bis(4-phenoxy)benzene-N,N'-bismaleimide, and 1,3-bis(3-phenoxy)benzene-N,N'-bismaleimide. The aforementioned compounds can be used either alone or in combination of two or more.

In the adhesive composition of the present invention, based on the total weight of the adhesive composition, the amount of the unsaturated monomer (A) can range from about 3 wt % to 50 wt %, preferably about 5 wt % to 40 wt %, and more preferably about 7 wt % to 35 wt %, such as 6 wt %, 7 wt %, 7.4 wt %, 8 wt %, 9 wt %, 10 wt %, 12 wt %, 13 wt %, 15 wt %, 17 wt %, 18 wt %, 20 wt %, 21 wt %, 22 wt %, 23 wt %, 25 wt %, 27 wt %, 30 wt %, 31 wt %, 32 wt %, 33 wt %, or 34 wt %.

1.2. Olefin Copolymer (B)

In the adhesive composition of the present invention, the olefin copolymer (B) has cross-linkable group(s) and comprises a repeating unit (B-1) of the following formula (I), a repeating unit (B-2) of the following formula (II), and a repeating unit (B-3) of the following formula (III).

formula (I)

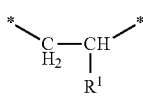

formula (II)

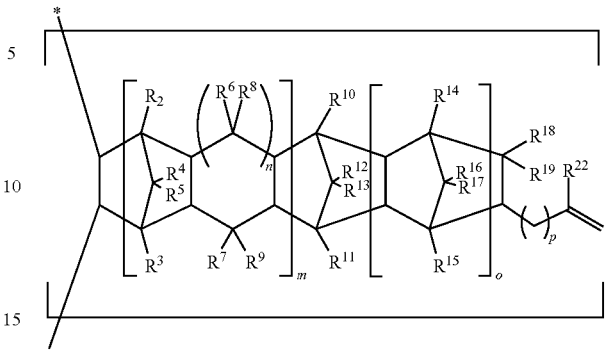

formula (III)

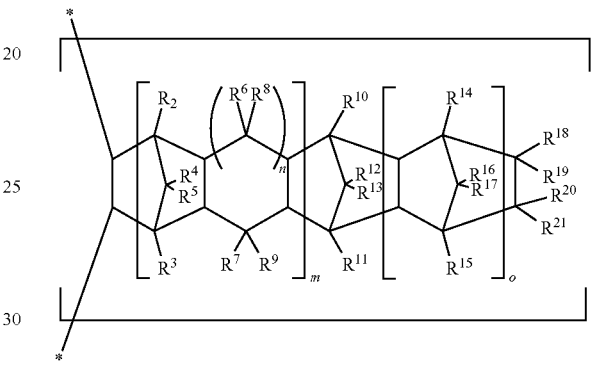

In formulas (I) to (III), $R^1$ is H or a $C_1$ to $C_{29}$ linear or branched hydrocarbon group, and preferably H or a $C_1$ to $C_{29}$ alkyl; $R^2$ to $R^{21}$ are independently H, halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aryl, and $R^{18}$ to $R^{21}$ may form a monocyclic ring or polycyclic ring by binding to each other; $R^{22}$ is H or a $C_1$ to $C_{10}$ alkyl; m and n are independently 0 or 1; o is 0 or a positive integer, preferably an integer between 0 and 50, and more preferably an integer between 0 and 20; p is an integer between 0 and 10; and in formula (III), when both m and n are 0, at least one of $R^{10}$ to $R^{13}$ and $R^{18}$ to $R^{21}$ is not H.

The repeating unit (B-1) of formula (I) is derived from one or more monomers of the following formula (I-1) through an addition copolymerization.

formula (I-1)

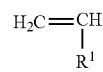

In formula (I-1), $R^1$ is H or a $C_1$ to $C_{29}$ linear or branched hydrocarbon group, preferably H or a $C_1$ to $C_{29}$ linear or branched hydrocarbon alkyl, and more preferably H or a $C_1$ to $C_6$ linear or branched hydrocarbon alkyl, such as methyl, ethyl, n-propyl, isopropyl, n-butyl, isobutyl, tert-butyl, n-pentyl, isopentyl, tert-pentyl, neopentyl, n-hexyl, or isohexyl.

Examples of the monomer of formula (I-1) include but are not limited to ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene. In the appended Examples, the repeating unit (B-1) of formula (I) is derived from ethylene through an addition copolymerization.

The repeating unit (B-2) of formula (II) is derived from one or more cyclic non-conjugated diene monomers of the following formula (II-1) through an addition copolymerization.

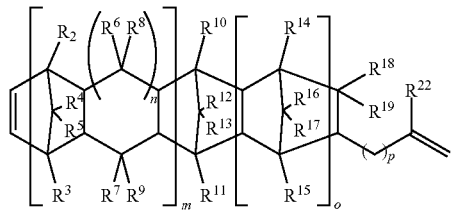

formula (II-1)

In formula (II-1), $R^2$ to $R^{19}$ may be identical or different and may be independently H, halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aryl, wherein $R^{18}$ and $R^{19}$ may form a monocyclic ring or polycyclic ring by binding to each other; $R^{22}$ is H or a $C_1$ to $C_{10}$ alkyl; m and n are independently 0 or 1; o is 0 or a positive integer, preferably an integer between 0 and 50, and more preferably an integer between 0 and 20; p is an integer between 0 and 10. It is preferable that $R^2$ to $R^{19}$ are independently H, a $C_1$ to $C_{10}$ alkyl, a $C_3$ to $C_8$ cycloalkyl, or a $C_6$ to $C_{12}$ aryl, $R^{22}$ is H or a $C_1$ to $C_6$ alkyl, and o is 0, 1, or 2. Examples regarding the $C_1$ to $C_{10}$ alkyl and the $C_6$ to $C_{12}$ aryl are as described above and will not be repeated here. Examples of the $C_3$ to $C_8$ cycloalkyl include but are not limited to cyclopropyl, cyclobutyl, cyclopentyl, cyclohexyl, cycloheptyl, and cyclooctyl.

Examples of the cyclic non-conjugated diene monomer of the formula (II-1) include but are not limited to

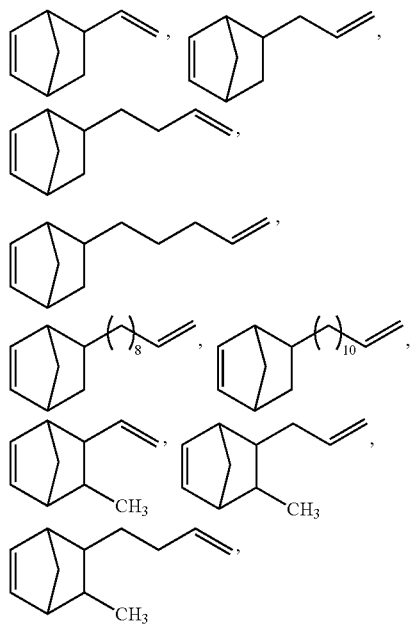

-continued

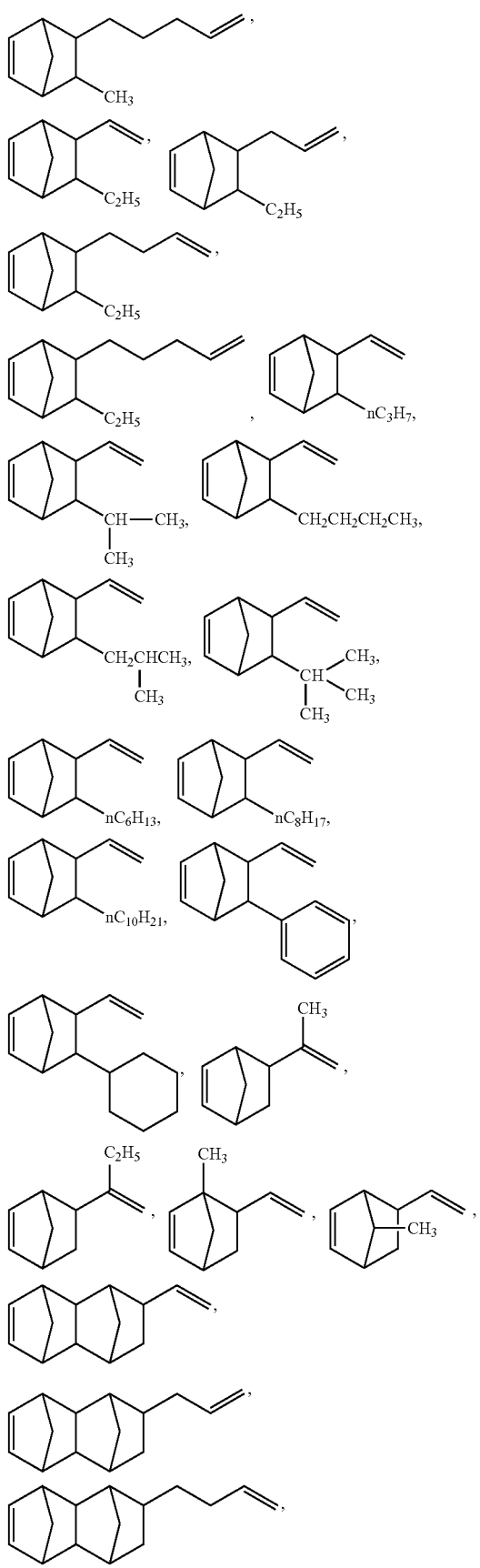

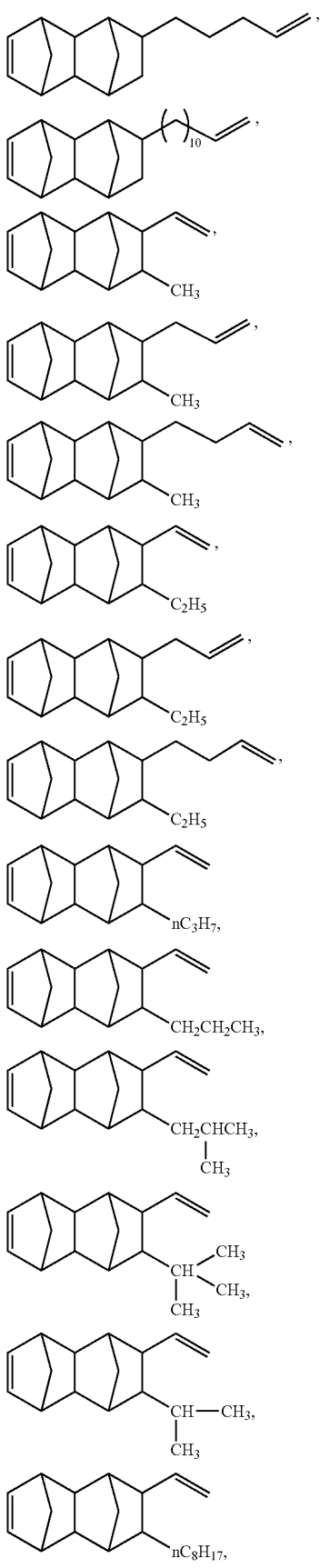
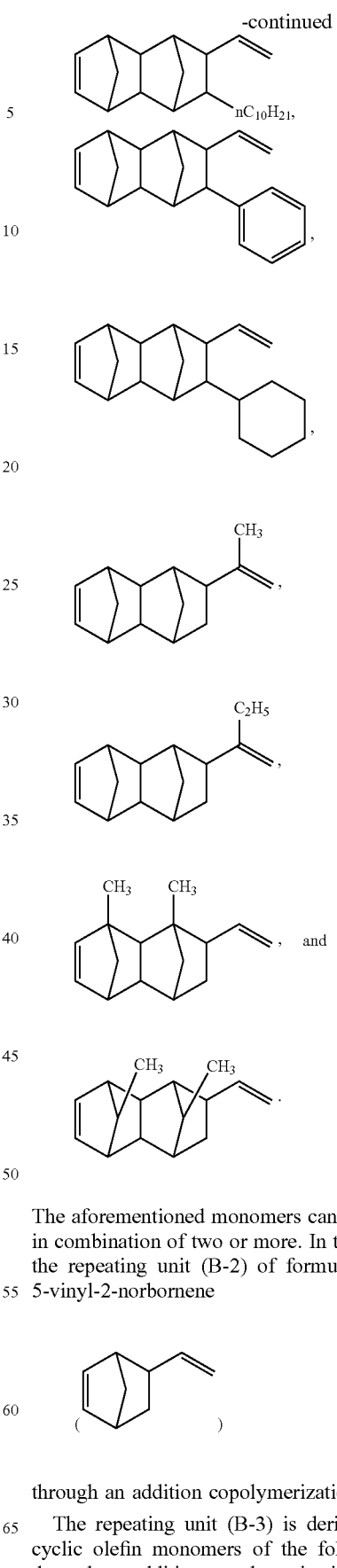
The aforementioned monomers can be used either alone or in combination of two or more. In the appended Examples, the repeating unit (B-2) of formula (II) is derived from 5-vinyl-2-norbornene
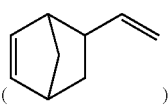
through an addition copolymerization.
The repeating unit (B-3) is derived from one or more cyclic olefin monomers of the following formula (III-1) through an addition copolymerization.

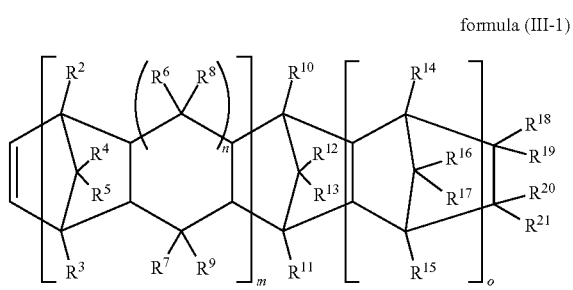
formula (III-1)

In formula (III-1), $R^2$ to $R^{19}$ are as defined above, the definition of $R^{20}$ and $R^{21}$ are identical to the definition of $R^2$ to $R^{19}$, wherein $R^{18}$ to $R^{21}$ may form a monocyclic ring or polycyclic ring by binding to each other; m and n are independently 0 or 1; o is 0 or a positive integer, preferably an integer between 0 and 50, and more preferably an integer between 0 and 20; and when both m and n are 0, at least one of $R^{10}$ to $R^{13}$ and $R^{18}$ to $R^{21}$ is not H.

Examples of the cyclic olefin monomer of formula (III-1) include but are not limited to bicyclo[2.2.1]-2-heptene (norbornene,

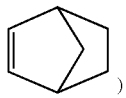
)

and tetracyclo[[4.4.0.1$^{2,5}$.1$^{7,10}$]-3-dodecene (tetracyclododecene,

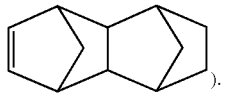
).

In the appended Examples, the repeating unit (B-3) of formula (III) is derived from tetracyclo[[4.4.0.1$^{2,5}$.1$^{7,10}$]-3-dodecene (tetracyclododecene,

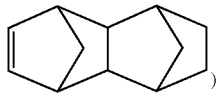
)

through an addition copolymerization.

In the olefin copolymer (B), based on the total moles of the repeating units (B-1), (B-2) and (B-3), the content of the repeating unit (B-2) ranges from about 19 mol % to 36 mol %, preferably from about 20 mol % to 33 mol %, and more preferably from about 25 mol % to 30 mol %. When the content of the repeating unit (B-2) is within the above designated ranges, the olefin copolymer (B) can impart long-term stable dielectric properties and excellent thermal resistance to the adhesive composition, and impart excellent balance between mechanical properties and dielectric properties to the adhesive composition.

Furthermore, in the olefin copolymer (B), based on the total moles of the repeating units (B-1) and (B-2), the content of the repeating unit (B-3) can range from about 0.1 mol % to 100 mol %, preferably from about 0.1 mol % to 50 mol %, and more preferably from about 1 mol % to 20 mol %. When the content of the repeating unit (B-3) is within the above designated ranges, the olefin copolymer (B) can maintain a proper elastic modulus and the cross-linking reaction thereof is easily to control.

In the adhesive composition of the present invention, in addition to the aforementioned repeating units (B-1), (B-2) and (B-3), the olefin copolymer (B) may further comprise one or more repeating units derived from other cyclic olefin monomers and/or linear olefin polyenes through an addition copolymerization. Said other cyclic olefin monomers exclude the cyclic non-conjugated diene monomers of formula (II-1) and the cyclic olefin monomers of formula (III-1).

The preparation of the olefin copolymer (B) can be found in, for example, U.S. Pat. No. 9,206,278 B2, and the subject matters of which are incorporated herein in their entirety by reference.

In the adhesive composition of the present invention, based on the total weight of the adhesive composition, the amount of the olefin copolymer (B) may range from about 50 wt % to 99 wt %, preferably from about 60 wt % to 97 wt %, and more preferably from about 65 wt % to 95 wt %, such as 66 wt %, 67 wt %, 68 wt %, 69 wt %, 70 wt %, 72 wt %, 73 wt %, 75 wt %, 76 wt %, 77 wt %, 78 wt %, 80 wt %, 82 wt %, 83 wt %, 85 wt %, 86 wt %, 86.5 wt %, 87 wt %, 88 wt %, 90 wt %, 90.5 wt %, 91 wt %, 92 wt %, 92.5 wt %, 93 wt %, or 94 wt %.

Furthermore, in the adhesive composition of the present invention, it is preferable that the weight ratio of the olefin copolymer (B) to the unsaturated monomer (A) is within a specific range, such that the laminate prepared thereby is provided with excellent room temperature peel strength and heat resistant peel strength. Specifically, the weight ratio of the olefin copolymer (B) to the unsaturated monomer (A) is preferably about 2 to 20, more preferably about 3.3 to 15. When the weight ratio of the olefin copolymer (B) to the unsaturated monomer (A) is within the above designated ranges, the unsaturated monomer (A) and the olefin copolymer (B) may ideally cross-linked with each other, such that the obtained adhesive composition could provide outstanding adhesion strength. A laminate prepared by using the adhesive composition can be provided with outstanding room temperature peel strength and heat resistant peel strength without changing other properties of the laminate. It was found that if the weight ratio of the olefin copolymer (B) to the unsaturated monomer (A) is above or below the above designated range, the adhesive composition, even being used in a higher amount, will not be able to provide a sufficient adhesion strength, such that the peel strength properties, especially heat resistant peel strength of the laminate prepared deteriorate.

1.3. Other Optional Constituents 1.3.1. Silane Coupling Agent (C)

The adhesive composition may optionally comprise a silane coupling agent (C) to facilitate the formation of covalent bonds in the adhesive composition or to constitute parts of covalent bonds, and thus to further improve the adhesion performance of the adhesive composition. The silane coupling agent (C) may include olefin-functional silane, epoxy-functional silane, vinyl-functional silane, propenyl-functional silane, amino-functional silane, and mercapto-functional silane. The silane coupling agent (C) can be represented by the following formula (V).

$$R\text{—}Si(OR')_l \quad \text{formula (V)}$$

In formula (V), R is an organic functional group, such as amino, vinyl, mercapto, phenyl, epoxy, acryloyl, and the like; OR' is a hydrolysable group, such as methoxy or ethoxy; and l is 2 or 3.

Examples of a silane coupling agent include but are not limited to N-(2-aminoethyl)-3-aminopropyl trimethoxy silane, N-phenyl-3-aminopropyl trimethoxy silane, 3-methacryloxy propyl trimethoxy silane, 4-epoxypropyl butyl trimethoxy silane, vinyl trimethoxy silane, vinyl phenyl trimethoxy silane, 3-mercaptopropyl methyl dimethoxy silane, 3-mercaptopropyl trimethoxy silane, and mixtures thereof. For example, the aforementioned silane coupling agents are commercially available from SHIN-ETSU CHEMICAL. The trade names of the products available from SHIN-ETSU CHEMICAL include KBM-503 (3-methacryloxy propyl trimethoxy silane), KBM-603 (N-(2-aminoethyl)-3-aminopropyl trimethoxy silane) and KBM-1003 (vinyl trimethoxy silane). In the appended Examples, 3-methacryloxy propyl trimethoxy silane, N-(2-aminoethyl)-3-aminopropyl trimethoxy silane, and vinyl trimethoxy silane are used as the silane coupling agent (C).

In the adhesive composition of the present invention, per 100 parts by weight of the adhesive composition, the amount of the silane coupling agent (C) may be about 0.1 parts by weight to 2 parts by weight, and preferably about 0.3 parts by weight to 1.5 parts by weight, such as 0.4 parts by weight, 0.5 parts by weight, 0.6 parts by weight, 0.7 parts by weight, 0.8 parts by weight, 1.0 parts by weight, 1.1 parts by weight, 1.2 parts by weight, or 1.4 parts by weight.

1.3.2. Other Additives

In addition to the silane coupling agent (C), the adhesive composition may optionally further comprise other constituents, such as conventional additives in the art, to improve the physicochemical properties of the electronic material manufactured by using the adhesive composition or the processability of the adhesive composition during the manufacturing process. Examples of said conventional additives include but are not limited to flame retardants, viscosity modifiers, thixotropic agents, defoaming agents, leveling agents, surface treating agents, stabilizers, and anti-oxidants. The aforementioned additives can be used either alone or in combination of two or more.

Examples of the flame retardant include but are not limited to phosphor-containing flame retardants and bromine-containing flame retardants. Examples of phosphor-containing flame retardants include but are not limited to phosphates, phosphazenes, poly ammonium phosphates, and melamine phosphates. Examples of bromine-containing flame retardants include but are not limited to tetrabromobisphenol A, decabromodiphenyloxide, decabrominated diphenyl ethane, 1,2-bis(tribromophenyl)ethane, brominated epoxy oligomers, octabromotrimethylphenyl indane, bis(2,3-dibromopropyl ether), tris(tribromophenyl)triazine, brominated aliphatic hydrocarbons, and brominated aromatic hydrocarbons. The aforementioned flame retardants can be used either alone or in combination of two or more.

The amount of each of the aforementioned additives is not particularly limited and can be adjusted depending on the need of persons with ordinary skill in the art after reading the disclosure of the subject specification.

2. Preparation of Adhesive Composition

The adhesive composition of the present invention may be prepared into varnish form for subsequent applications by evenly mixing the adhesive composition (including the unsaturated monomer (A), the olefin copolymer (B), optional silane coupling agent (C), and other optional constituents) through a stirrer and dissolving or dispersing the obtained mixture into a solvent. The solvent here can be any inert solvent that can dissolve or disperse the constituents of the adhesive composition of the present invention, but does not react with the constituents. For example, the solvent which can dissolve or disperse the constituents of the adhesive composition include but are not limited to benzene, toluene, xylene, hexane, cyclohexane, heptane, and decane. The listed solvents can be either used alone or in combination of two or more. The amount of the solvent is not particularly limited as long as the constituents of the adhesive composition can be evenly dissolved or dispersed therein. In the appended Examples, xylene is used as the solvent.

3. Laminate

The present invention also provides a laminate prepared by using the aforementioned adhesive composition. The laminate comprises a conductive layer, a dielectric layer, and an adhesive layer disposed between the conductive layer and the dielectric layer for adhering the conductive layer to the dielectric layer, wherein the adhesive layer is prepared from the aforementioned adhesive composition. In the laminate of the present invention, the constitution of the adhesive composition for forming the adhesive layer can be different from the constitution of the resin composition for forming the dielectric layer. The detailed description for each component of the laminate are provided below.

3.1. Conductive Layer

In the laminate of the present invention, the conductive layer includes but is not limited to conductive metal slices (also known as conductive metal foils). The conductive metal slices include but are not limited to copper foils, nickel foils, or aluminum foils, among which copper foils are preferred. Generally, the thickness of the conductive layer may be about 0.1 μm to about 35 μm, and preferably about 0.1 μm to about 18 μm, but the present invention is not limited thereto. The surface of the conductive metal foils may be smooth or may be roughened. In general, the conductive metal slice preferably has low roughness because high roughness is unfavorable to signal transmission. However, the adhesion strength between the conductive metal slice with lower roughness and the dielectric layer is unsatisfactory, which will cause a deterioration in the peel strength of the laminate as well as the reliability of the printed circuit board. Regarding to the poor adhesion strength technical problem, the adhesive layer formed from the adhesive composition of the present invention effectively enhances the adhesion strength between the conductive metal slice (conductive layer) and the dielectric layer, thereby improving the peel strength of the laminate. The adhesive layer will be described hereafter.

3.2. Dielectric Layer

In the laminate of the present invention, the dielectric layer is prepared from one or more prepregs. The prepreg may be prepared by impregnating a reinforcing material into a curable resin or coating a curable resin onto a reinforcing material, and then drying the impregnated or coated reinforcing material. Alternatively, the prepreg may be prepared by directly coating a curable resin onto a substrate and drying the curable resin, and then removing the dried curable resin from the substrate. Examples of the curable resin include but are not limited to polyphenylene ether resins, epoxy resins, phenolic resins, polyformaldehyde resins, silicones, and polytetrafluoroethylene. The aforementioned curable resins can be used either alone or in combination of two or more. Examples of the reinforcing material include but are not limited to glass fiber fabrics, glass fiber mats, insulating papers, and linen fabrics. In some embodiments of the present invention, a polyphenylene ether resin with reactive functional groups is used as the curable resin, and glass fiber fabric is used as the reinforcing material.

Polyphenylene ether resins with reactive functional groups include but are not limited to polyphenylene ether resins with acryl groups, polyphenylene ether resins having vinyl groups, and polyphenylene ether resins with hydroxyl groups. The term "reactive functional group" in the context can be any group capable of conducting a curing reaction, such as hydroxyl groups, carboxyl groups, alkenyl groups, and amino groups, but the present invention is not limited thereto. Examples of polyphenylene ether resins with reactive functional groups particularly include the polyphenylene resins of the following formula (VI).

formula (VI)

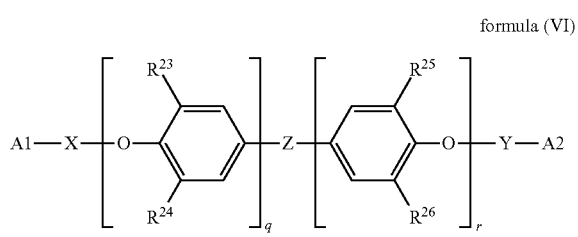

In formula (VI), A1 and A2 are independently

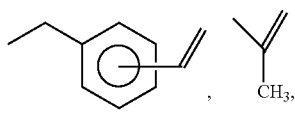

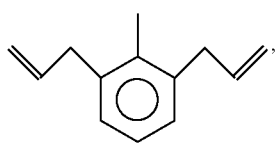

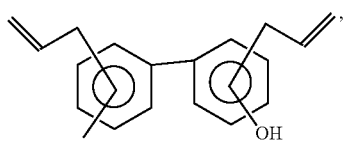

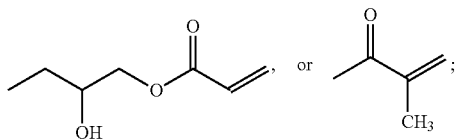

$R^{23}$ to $R^{26}$ are independently H or a substituted or unsubstituted $C_1$ to $C_5$ alkyl, such as methyl, ethyl, n-propyl, isopropyl, n-butyl, and the like; q and r are independently an integer between 0 and 100, with the proviso that q and r are not 0 at the same time, the range of q and r is preferably $1 \leq (q+r) \leq 100$, and more preferably $5 \leq (q+r) \leq 30$; Z is absent, —O—,

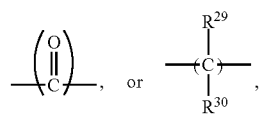

wherein $R^{29}$ and $R^{30}$ are independently H or a $C_1$ to $C_{12}$ alkyl; and X and Y are independently

an alkenyl-containing group or absent. It is preferable that X and Y are both absent,

or X has the structure of the following formula (VI-1) and Y has the structure of the following formula (VI-2).

formula (VI-1)

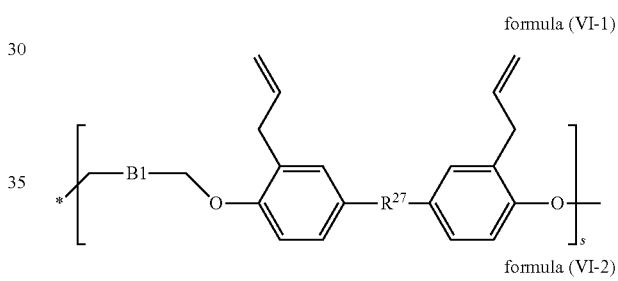

formula (VI-2)

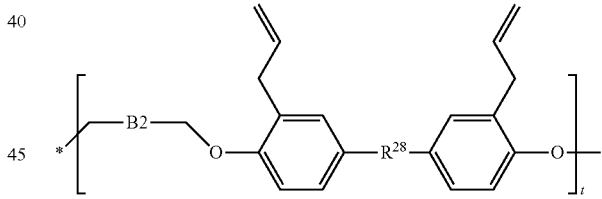

In formulas (VI-1) and (VI-2), * indicates the end connecting oxygen (—O—) of formula (VI); B1 and B2 are independently

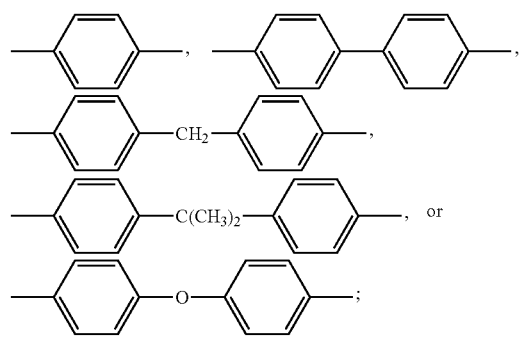

$R^{27}$ and $R^{28}$ are independently —O—, —$SO_2$—, or —$C(CH_3)_2$—, or absent; and s and t are independently an integer, with the proviso that $1 \le (s+t) < 20$, preferably $1 \le (s+t) < 10$, and more preferably $1 \le (s+t) < 3$.

Examples of epoxy resins include but are not limited to epoxy resins represented by the following formula (VII).

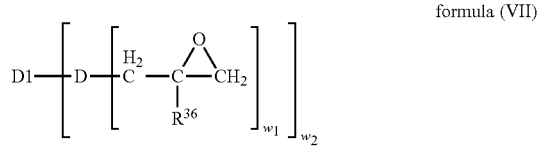

formula (VII)

In formula (VII), D1 is an organic or inorganic group with a valence of $w_2$, $R^{36}$ is H or a $C_1$ to $C_6$ alkyl, D is oxygen or nitrogen, $w_1$ is 1 or 2 and consistent with the valence of D, and $w_2$ is an integer between 1 and 100, preferably an integer between 2 and 8, and most preferably an integer between 2 and 4.

Examples of epoxy resins also include products produced by the reaction of epichlorohydrin or epibromohydrin with phenolic compounds. For example, suitable phenolic compounds include resorcinol, catechol, hydroquinone, 2,6-dihydroxy naphthalene, 2,7-dihydroxy naphthalene, 2-(diphenylphosphoryl)hydroquinone, bis(2,6-dimethylphenol), 2,2'-biphenol, 4,4-biphenol, 2,2',6,6'-tetramethylbiphenol, 2,2',3,3',6,6'-hexamethylbiphenol, 3,3',5,5'-tetrabromo-2,2'6,6'-tetramethylbiphenol, 3,3'-dibromo-2,2',6,6'-tetramethylbiphenol, 2,2',6,6'-tetramethyl-3,3'-dibromobiphenol, 4,4'-isopropylidenediphenol (bisphenol A), 4,4'-isopropylidenebis(2,6-dibromophenol) (tetrabromobisphenol A), 4,4'-isopropylidenebis(2,6-dimethylphenol) (teramethylbisphenol A), 4,4'-isopropylidenebis(2-methylphenol), 4,4'-isopropylidenebis(2-allylphenol), 4,4'-(1,3-phenylenediisopropylidene)bisphenol (bisphenol M), 4,4'-isopropylidenebis(3-phenylphenol), 4,4'-(1,4-phenylenediisoproylidene)bisphenol (bisphenol P), 4,4'-ethylidenediphenol (bisphenol E), 4,4'-oxydiphenol, 4,4'-thiodiphenol, 4,4'-thiobis(2,6-dimethylphenol), 4,4'-sulfonyldiphenol, 4,4'-sulfonylbis(2,6-dimethylphenol), 4,4'-sulfinyldiphenol, 4,4'-(hexafluoroisoproylidene)bisphenol (Bisphenol AF), 4,4'-(1-phenylethylidene)bisphenol (Bisphenol AP), bis(4-hydroxyphenyl)-2,2-dichloroethylene (Bisphenol C), bis(4-hydroxyphenyl)methane (Bisphenol F), bis(2,6-dimethyl-4-hydroxyphenyl)methane, 4,4'-(cyclopentylidene)diphenol, 4,4'-(cyclohexylidene)diphenol (Bisphenol Z), 4,4'-(cyclododecylidene)diphenol, 4,4'-(bicyclo[2.2.1]heptylidene)diphenol, 4,4'-(9H-fluorene-9,9-diyl)diphenol, 3,3-bis(4-hydroxyphenyl)isobenzofuran-1 (3H)-one, 1-(4-hydroxyphenyl)-3,3-dimethyl-2,3-dihydro-1H-inden-5-ol, 1-(4-hydroxy-3,5-dimethylphenyl)-1,3,3,4,6-pentamethyl-2,3-dihydro-1H-inden-5-ol, 3,3,3',3'-tetramethyl-2,2',3,3'-tetrahydro-1,1'-spirobi[indene]-5-,6'-diol (Spirobiindane), dihydroxybenzophenone (bisphenol K), tris(4-hydroxyphenyl)methane, tris(4-hydroxyphenyl)ethane, tris(4-hydroxyphenyl)propane, tris(4-hydroxyphenyl)butane, tris(3-methyl-4-hydroxyphenyl)methane, tris(3,5-dimethyl-4-hydroxyphenyl)methane, tetrakis(4-hydroxyphenyl)ethane, tetrakis(3,5-dimethyl-4-hydroxyphenyl)ethane, bis(4-hydroxyphenyl) phenylphosphine oxide, dicyclopentadienylbis(2,6-dimethyl phenol), dicyclopentadienyl bis(2-methylphenol), and dicyclopentadienyl bisphenol. The aforementioned phenolic compounds may be used either alone or in combination of two or more. The synthesis method of the epoxy resin is not one of the features of the invention and can be performed by persons with ordinary skill in the art based on their ordinary skill after reading the disclosure of the subject application and therefore, will not be described in detail.

3.3. Adhesive Layer

In the laminate of the present invention, the adhesive layer is prepared from the adhesive composition of the present invention and disposed between the conductive layer and the dielectric layer to improve the adhesion strength between the conductive layer and the dielectric layer. The adhesive layer may be formed by applying the adhesive composition between the conductive layer and the dielectric layer by using conventional coating methods in the art and then drying the applied adhesive composition. The conventional coating methods include screen printing, roller coating, die coating, dip coating, spray coating, and the like.

By using the adhesive layer, the laminate of the present invention could have improved adhesion strength between the conductive layer and the dielectric layer without altering the formulation of the dielectric layer. In other words, the constitution of the adhesive layer can be different from the constitution of the dielectric layer. This provides flexibility in terms of the properties of the laminate.

According to the present invention, the weight of the adhesive layer is preferably about 2 $g/m^2$ to 18 $g/m^2$, and more preferably about 3 $g/m^2$ to 10 $g/m^2$. When the weight of the adhesive layer is within the above designated range, the adhesive layer can provide outstanding adhesion strength to improve the peel strength of the laminate without changing other properties of the laminate.

3.4. Embodiments of Laminate

FIG. 1 is a schematic diagram showing an embodiment of the laminate of the present invention. As shown in FIG. 1, the laminate 10 comprises a conductive layer 11, an adhesive layer 12, and a dielectric layer 13, wherein the adhesive layer 12 is formed from the adhesive composition of the present invention and disposed between the conductive layer 11 and the dielectric layer 13. The conductive layer 11 may be a copper foil. The adhesive layer 12 and the dielectric layer 13 may be independently in a semi-cured state or in a cured state.

Figure 2:
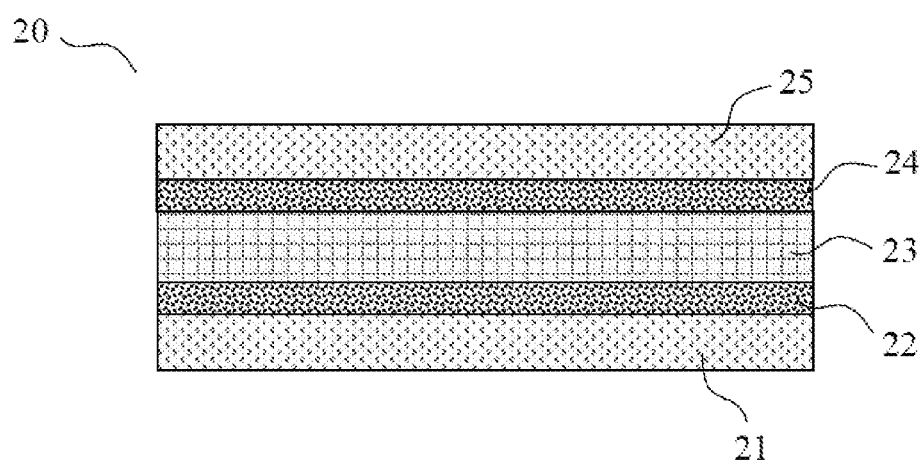
FIG. 2 is a schematic diagram showing another embodiment of the laminate of the present invention.

FIG. 2 is a schematic diagram showing another embodiment of the laminate of the present invention. As shown in FIG. 2, the laminate 20 comprises a first conductive layer 21, a first adhesive layer 22, a dielectric layer 23, a second adhesive layer 24, and a second conductive layer 25, wherein the first adhesive layer 22 is disposed between the first conductive layer 21 and the dielectric layer 23, and the second adhesive layer 24 is disposed between the dielectric layer 23 and the second conductive layer 25. The materials of the first conductive layer 21 and the second conductive layer 25 may be identical or different, and may be metal foils such as copper foils. The first adhesive layer 22 and the second adhesive layer 24 may be formed from the adhesive compositions of the present invention with identical or different formulations. In addition, the laminate 20 can only comprise the first adhesive layer 22 or the second adhesive layer 24.

4. Preparation of Laminate

The present invention also provides a method of preparing a laminate by using the aforementioned adhesive composition. The method comprises the following steps: providing a conducive layer and a dielectric layer; and providing an adhesive layer between the conductive layer and the dielectric layer for adhering the conductive layer to the dielectric layer, wherein the adhesive layer is prepared from the aforementioned adhesive composition. According to the method of the present invention, the laminate may be obtained by coating the adhesive composition onto at least one of the conductive layer and the dielectric layer, superimposing the dielectric layer and the conductive layer to form a structure sequentially including the conductive layer, the adhesive composition layer and the dielectric layer, and hot-pressing the structure to obtain the laminate. Alternatively, the laminate may be obtained by forming the adhesive composition into an adhesive layer in advance, superimposing the dielectric layer, the adhesive layer, and the conductive layer to form a structure sequentially including the conductive layer, the adhesive layer and the dielectric layer, and hot-pressing the structure to obtain the laminate.

5. Printed Circuit Board

The laminate of the present invention may be used for preparing a printed circuit board. Thus, the present invention also provides a printed circuit board, which is prepared by further patterning the conductive layer of the aforementioned laminate. The patterning methods include but are not limited to etching. The patterning method is not one of the features of the invention and will not be described in detail.

Figure 3:
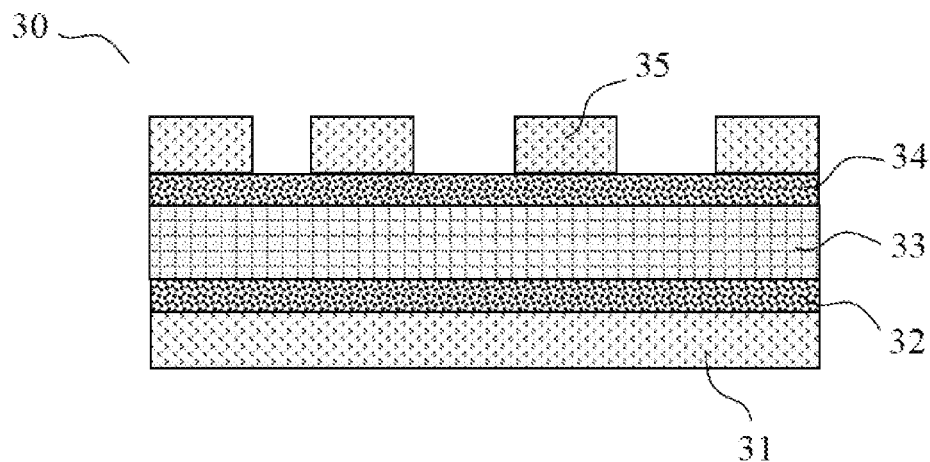
FIG. 3 is a schematic diagram showing an embodiment of the printed circuit board of the present invention.

FIG. 3 is a schematic diagram showing an embodiment of the printed circuit board of the present invention. As shown in FIG. 3, the printed circuit board 30 comprises a first conductive layer 31, a first adhesive layer 32, a dielectric layer 33, a second adhesive layer 34, and a patterned second conductive layer 35, wherein the first adhesive layer 32 is disposed between the first conductive layer 31 and the dielectric layer 33, and the second adhesive layer 34 is disposed between the dielectric layer 33 and the patterned second conductive layer 35. The materials of the first conductive layer 31 and the patterned second conductive layer 35 may be identical or different, and may be metal foils such as copper foils. The first adhesive layer 32 and the second adhesive layer 34 may be formed from the adhesive compositions of the present invention with identical or different formulations. In addition, the printed circuit board 30 can only comprise the first adhesive layer 32 or the second adhesive layer 34.

Figure 4:
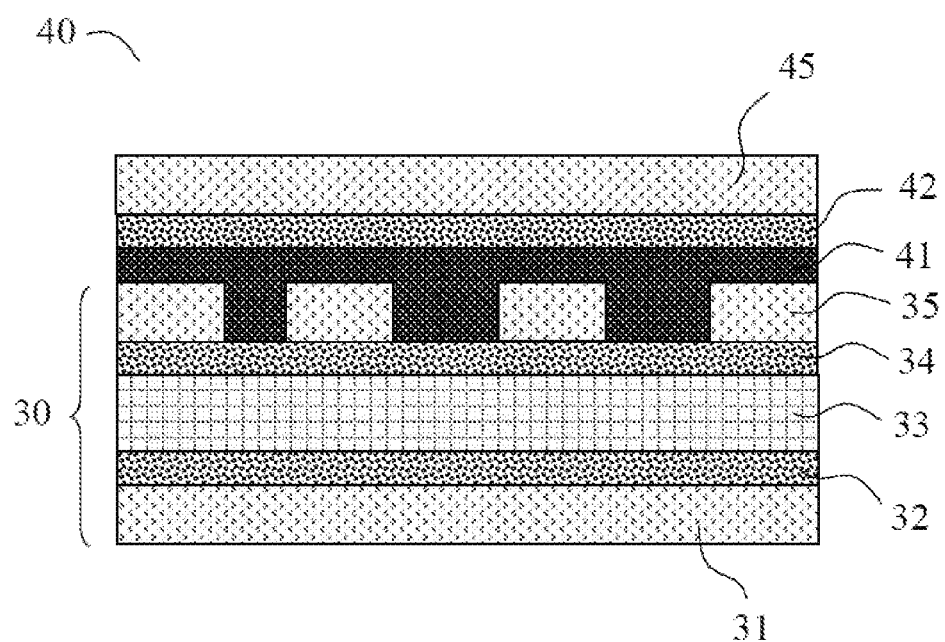
FIG. 4 is a schematic diagram showing another embodiment of the printed circuit board of the present invention.

FIG. 4 is a schematic diagram showing another embodiment of the printed circuit board of the present invention. As shown in FIG. 4, the printed circuit board 40 comprises a first conductive layer 31, a first adhesive layer 32, a dielectric layer 33, a second adhesive layer 34, a patterned second conductive layer 35, a bonding layer 41, a third adhesive layer 42, and a third conductive layer 45, wherein the first adhesive layer 32 is disposed between the first conductive layer 31 and the dielectric layer 33, the second adhesive layer 34 is disposed between the dielectric layer 33 and the patterned second conductive layer 35, and the third adhesive layer 42 is disposed between the bonding layer 41 and the third conductive layer 45. As shown in FIG. 4, the bonding layer 41 and the second adhesive layer 34 are disposed on the opposite sides of the patterned second conductive layer 35, respectively. The third conductive layer 45 and the patterned second conductive layer 35 are disposed on the opposite two sides of the bonding layer 41, respectively. The materials of the first conductive layer 31, the patterned second conductive layer 35, and the third conductive layer 45 may be identical or different, and nay be metal foils such as copper foils. The first adhesive layer 32, second adhesive layer 34, and third adhesive layer 42 may be formed from the adhesive compositions of the present invention with identical or different formulations. In addition, the printed circuit board 40 may not include the third adhesive layer 42.

The present invention will be further illustrated by the embodiments hereinafter, wherein the measuring instruments and methods are respectively as follows:

[Room Temperature Peel Strength Test]

The room temperature peel strength was tested by measuring the peel strength of the conductive layer of the laminate to the dielectric layer of the laminate in accordance with IPC TM-650 2.4.8 Peel Strength Test without performing any pretreatment to the laminate. The unit of the peel strength is lbf/in.

[Heat Resistant Peel Strength Test]

The specimen of the laminate was subjected to a solder float in a soldering tin furnace at 288° C. for 10 seconds, and the above procedures were repeated five times for each specimen. Thereafter, the heat resistant peel strength test was tested by measuring the strength of the conductive layer of the solder-treated laminate to the dielectric layer of the solder-treated laminate in accordance with the IPC TM-650 2.4.8 Peel Strength Test.

[Dielectric Constant (Dk) and Dissipation Factor (Df) Measurement]

Dk and Df of the laminate are measured and calculated according to IPC TM-650 under an operating frequency of 10 GHz.

6. Examples 6.1. Preparation of Adhesive Composition

[Adhesive Composition 1]

According to the ratio shown in Table 1, triallyl isocyanurate (TAIC) (available from Evonik Company) as the unsaturated monomer, and the olefin copolymer (comprising 64.6 mol % of the repeating unit (B-1)

29.2 mol % of the repeating unit (B-2)

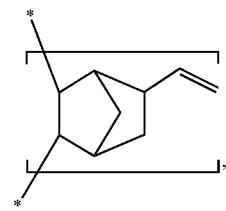

and 6.2 mol % of the repeating unit (B-3)

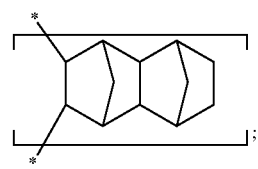

trade name: LCOC, available from MITSUI CHEMICALS) were mixed under room temperature with a stirrer followed by adding xylene. After stirring the resultant mixture under room temperature for 60 minutes, adhesive composition 1 was obtained.

[Adhesive Composition 2]

The preparation procedures of adhesive composition 1 were repeated to prepare adhesive composition 2, except that the amount of the unsaturated monomer was adjusted as shown in Table 1.

[Adhesive Composition 3]

The preparation procedures of adhesive composition 1 were repeated to prepare adhesive composition 3, except that the amount of the unsaturated monomer was adjusted as shown in Table 1.

[Adhesive Composition 4]

The preparation procedures of adhesive composition 1 were repeated to prepare adhesive composition 4, except that the amount of the unsaturated monomer was adjusted as shown in Table 1.

[Adhesive Composition 5]

The preparation procedures of adhesive composition 2 were repeated to prepare adhesive composition 5, except that a silane coupling agent (trade name: KBM-503, available from SHIN-ETSU CHEMICAL) was further added as shown in Table 1.

DCP, available from SHIN-NAKAMURA CHEMICAL) was used as the unsaturated monomer as shown in Table 1.

[Comparative Adhesive Composition 1]

According to the ratio shown in Table 1, the olefin copolymer LCOC and xylene were mixed and stirred under room temperature with a stirrer for 60 minutes to obtain a comparative adhesive composition 1.

[Comparative Adhesive Composition 2]

The preparation procedures of adhesive composition 1 were repeated to prepare comparative adhesive composition 2, except that the amount of the unsaturated monomer was adjusted such that the weight ratio of the olefin copolymer to the unsaturated monomer is higher than 15 as shown in Table 1.

[Comparative Adhesive Composition 3]

The preparation procedures of adhesive composition 1 were repeated to prepare comparative adhesive composition 3, except that the amount of the unsaturated monomer was adjusted such that the weight ratio of the olefin copolymer to the unsaturated monomer is lower than 3.3 as shown in Table 1.

TABLE 1

| | | Composition of adhesive compositions | | | | | | |
|---|---|---|---|---|---|---|---|---|
| Unit: parts by weight | | Unsaturated monomer | | | Olefin copolymer | Silane coupling agent | | |
| | | TAIC | DVB | DCP | LCOC | KBM-503 | KBM-603 | KBM-1003 |
| Adhesive composition | 1 | 8 | 0 | 0 | 100 | 0 | 0 | 0 |
| | 2 | 15 | 0 | 0 | 100 | 0 | 0 | 0 |
| | 3 | 30 | 0 | 0 | 100 | 0 | 0 | 0 |
| | 4 | 45 | 0 | 0 | 100 | 0 | 0 | 0 |
| | 5 | 15 | 0 | 0 | 100 | 0.5 | 0 | 0 |
| | 6 | 15 | 0 | 0 | 100 | 0 | 0.5 | 0 |
| | 7 | 15 | 0 | 0 | 100 | 0 | 0 | 0.5 |
| | 8 | 0 | 10 | 0 | 100 | 0.5 | 0 | 0 |
| | 9 | 0 | 0 | 10 | 100 | 0.5 | 0 | 0 |
| Comparative adhesive composition | 1 | 0 | 0 | 0 | 100 | 0 | 0 | 0 |
| | 2 | 4 | 0 | 0 | 100 | 0 | 0 | 0 |
| | 3 | 60 | 0 | 0 | 100 | 0 | 0 | 0 |

[Adhesive Composition 6]

The preparation procedures of adhesive composition 5 were repeated to prepare adhesive composition 6, except that the silane coupling agent KBM-503 was substituted by another silane coupling agent (available from SHIN-ETSU CHEMICAL, trade name: KBM-603) as shown in Table 1.

[Adhesive Composition 7]

The preparation procedures of adhesive composition 5 were repeated to prepare adhesive composition 7, except that the silane coupling agent KBM-503 was substituted by another silane coupling agent (available from SHIN-ETSU CHEMICAL, trade name: KBM-1003) as shown in Table 1.

[Adhesive Composition 8]

The preparation procedures of adhesive composition 5 were repeated to prepare adhesive composition 8, except that divinylbenzene (DVB) (available from NIPPON STEEL & SUMIKIN CHEMICAL) was used as the unsaturated monomer, and the amount of the unsaturated monomer was adjusted as shown in Table 1.

[Adhesive Composition 9]

The preparation procedures of adhesive composition 8 were repeated to prepare adhesive composition 9, except that tricyclodecane dimethanol di(meth)acrylate (trade name:

6.2. Preparation of Laminate 6.2.1. Laminates 1 to 9 and Comparative Laminates 1 to 3

Laminates 1 to 9 and comparative laminates 1 to 3 were prepared by using adhesive compositions 1 to 9 and comparative adhesive compositions 1 to 3. In detail, each of the adhesive compositions and comparative adhesive compositions was coated onto a 0.5 oz. non-profile copper foil (Rz: 0.1 µm; available from MITSUI MINING & SMELTING) by using a wire bar, and heated at 150° C. for 3 minutes to provide an adhesive layer on the non-profile copper foil. Next, prepregs (trade name: 933P, available from Taiwan Union Technology Corporation) were superimposed onto the adhesive layer on the side that is not contact with the non-roughness copper foil to provide a superimposed object. Afterwards, the superimposed object was subjected to a hot-pressing operation by using a hot-pressing machine to provide the laminate. Herein, the hot-pressing conditions are as follows: raising the temperature to 200° C. to 220° C. with a heating rate of 3.0° C./min, and hot-pressing for 180 minutes under a full pressure of 15 kg/cm$^2$ (initial pressure is 8 kg/cm$^2$) at said temperature. The weights of the adhesive layers of laminates 1 to 9 (corresponding to adhesive compositions 1 to 9, respectively) and comparative laminates 1 to 3 (corresponding to comparative adhesive compositions 1 to 3, respectively) were measured and tabulated in Table 2, respectively.

6.2.2. Laminates 10 to 12 and Comparative Laminate 4

Laminates 10 to 12 were prepared according to the preparation procedures of laminates 1 to 9, by using adhesive composition 6, except that the amount of adhesive composition 6 was adjusted such that the adhesive layers of laminates 10 to 12 are different in weight, as shown in Table 2. In addition, comparative laminate 4 was prepared by directly superimposing the prepregs with a non-profile copper foil to provide a superimposed object, and hot-pressing the superimposed object under the hot-pressing conditions identical to those indicated in the "6.2.1. Laminates 1 to 9 and comparative laminates 1 to 3".

6.2.3. Evaluation of Properties of Laminates

The room temperature peel strength, heat resistant peel strength, dielectric constant (Dk) and dissipation factor (Df) of laminates 1 to 12 and comparative laminates 1 to 4 were analyzed, and the results are tabulated in Table 2.

TABLE 2

Properties of laminates

| Unit | | Room temperature peel strength lbf/in | Heat resistant peel strength lbf/in | Dk @ 10 GHz | Df @ 10 GHz | Weight of adhesive layer g/m² |
|---|---|---|---|---|---|---|
| Laminate | 1 | 3.5 | 3.3 | 3.4 | 0.0024 | 7.2 |
| | 2 | 3.4 | 3.4 | 3.4 | 0.0024 | 6.6 |
| | 3 | 3.4 | 3.4 | 3.4 | 0.0024 | 7.3 |
| | 4 | 3.0 | 3.0 | 3.4 | 0.0024 | 7.6 |
| | 5 | 4.3 | 4.3 | 3.4 | 0.0024 | 6.8 |
| | 6 | 4.4 | 4.3 | 3.4 | 0.0024 | 7.6 |
| | 7 | 3.8 | 3.8 | 3.4 | 0.0024 | 8.2 |
| | 8 | 4.1 | 4.0 | 3.4 | 0.0024 | 7.8 |
| | 9 | 4.0 | 3.9 | 3.4 | 0.0024 | 7.2 |
| | 10 | 3.3 | 3.2 | 3.4 | 0.0024 | 2.8 |
| | 11 | 4.9 | 4.9 | 3.3 | 0.0023 | 10.2 |
| | 12 | 5.4 | 5.4 | 3.3 | 0.0023 | 16.5 |
| Comparative laminate | 1 | 3.3 | 2.3 | 3.4 | 0.0024 | 7.1 |
| | 2 | 3.3 | 2.5 | 3.4 | 0.0024 | 6.8 |
| | 3 | 2.4 | 2.3 | 3.4 | 0.0025 | 8.0 |
| | 4 | 2.2 | 2.0 | 3.4 | 0.0025 | 0 |

As shown in Table 2, the results of laminates 1 to 12 demonstrate that the adhesive composition of the present invention can effectively enhance the adhesion strength between the conductive layer and the dielectric layer, and thereby can effectively enhance the room temperature peel strength and heat resistant peel strength of the laminates (both higher than 3.0 lbf/in). In addition, the room temperature peel strength and heat resistant peel strength may be further improved by adjusting the amount of the adhesive composition. The results of comparative laminates 1 to 3 demonstrate that when the adhesive composition does not comprise the unsaturated monomer or the amount of the unsaturated monomer exceeds the designated range, the heat resistant peel strength of the laminate is poor (only 2.5 lbf/in) even though the laminate may have acceptable room temperature peel strength. In addition, the result of comparative laminate 4 demonstrates that the room temperature peel strength and heat resistant peel strength of the laminate both significantly deteriorate (to only 2.4 lbf/in) when the adhesive composition is not used in the preparation of the laminate.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF NUMERAL REFERENCES 10, 20: laminate
13, 23, 33: dielectric layer
12: adhesive layer
22, 32: first adhesive layer
21, 31: first conductive layer
24, 34: second adhesive layer
25, 35: second conductive layer
30, 40: printed circuit board
41: bonding layer
42: third adhesive layer
45: third conductive layer

What is claimed is:

1. An adhesive composition, comprising:

(A) an unsaturated monomer; and (B) an olefin copolymer comprising the following repeating units:

(B-1) a repeating unit of formula (I),

(B-2) a repeating unit of formula (II),

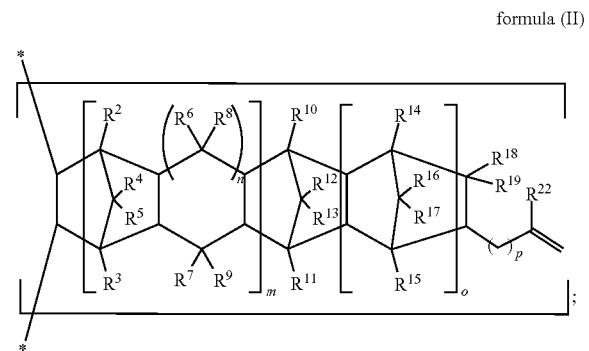

and
(B-3) a repeating unit of formula (III),

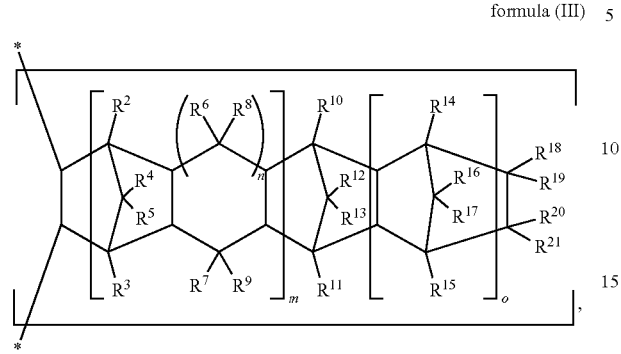

formula (III)

in formulas (I) to (III),
$R^1$ is H or a $C_1$ to $C_{29}$ linear or branched hydrocarbon group;
$R^2$ to $R^{21}$ are independently H, halogen, a $C_1$ to $C_{20}$ alkyl, a $C_1$ to $C_{20}$ halogenated alkyl, a $C_3$ to $C_{15}$ cycloalkyl, or a $C_6$ to $C_{20}$ aryl, and $R^8$ to $R^{21}$ may form a monocyclic ring or polycyclic ring by binding to each other;
$R^{22}$ is H or a $C_1$ to $C_{10}$ alkyl;
m and n are independently 0 or 1;
o is 0 or a positive integer;
p is an integer of 0 to 10; and
in formula (III), when both m and n are 0, at least one of $R^{10}$ to $R^{13}$ and $R^{18}$ to $R^{21}$ is not H,
wherein based on the total moles of the repeating units (B-1), (B-2) and (B-3), the content of the repeating unit (B-2) is about 19 mol % to 36 mol %; and
wherein the weight ratio of the olefin copolymer (B) to the unsaturated monomer (A) is about 2 to 20.

2. The adhesive composition of claim 1, wherein the unsaturated monomer (A) is selected from the group consisting of vinyl-containing aromatic monomers, allyl-containing monomers, acryloyl-containing monomers, vinyl ethers, maleimide compounds, and combinations thereof.

3. The adhesive composition of claim 2, wherein the allyl-containing monomer is selected from the group consisting of diallyl phthalate, diallyl isophthalate, triallyl mellitate, triallyl mesate, triallyl benzene, triallyl cyanurate, triallyl isocyanurate, triallyl amine, and combinations thereof.

4. The adhesive composition of claim 1, wherein $R^1$ is H or a $C_1$ to $C_6$ alkyl.

5. The adhesive composition of claim 1, wherein the repeating unit (B-2) is derived from one or more cyclic non-conjugated diene monomers through an addition copolymerization, wherein the one or more cyclic non-conjugated diene monomers are selected from the group consisting of

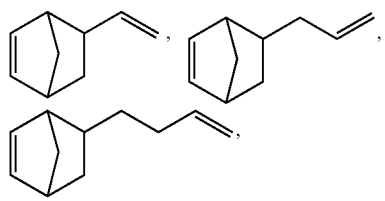

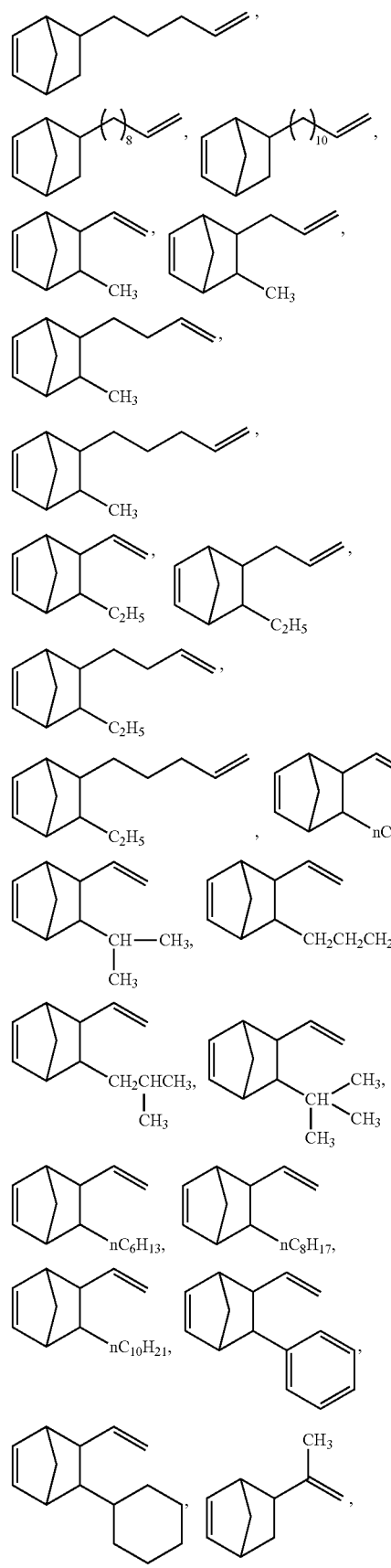

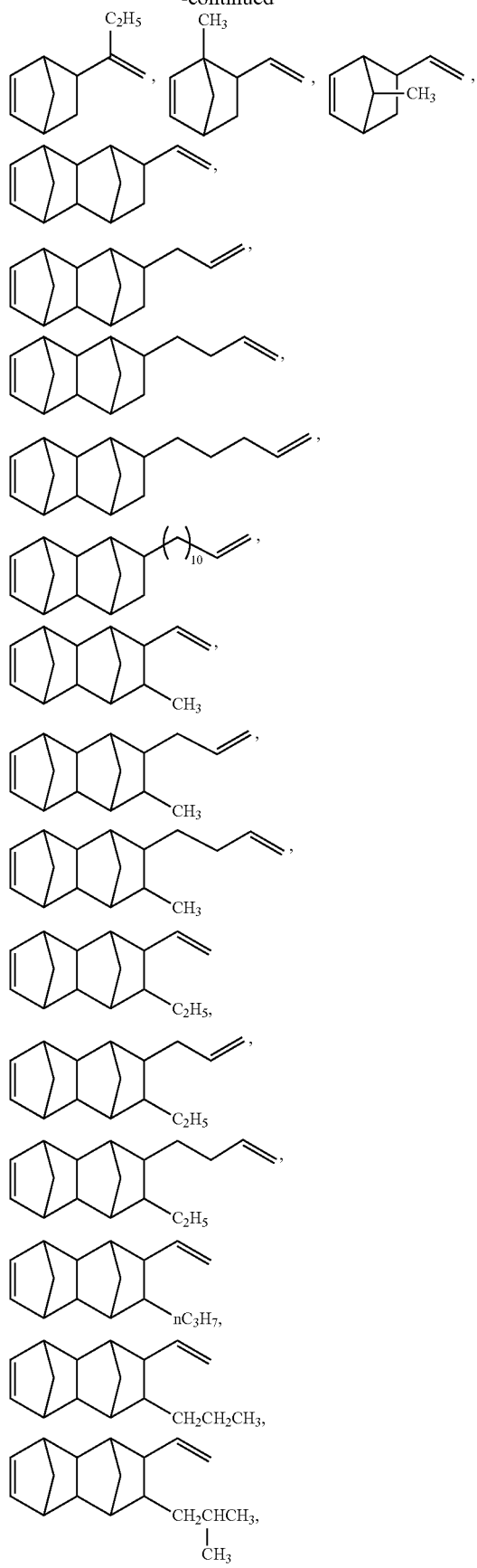

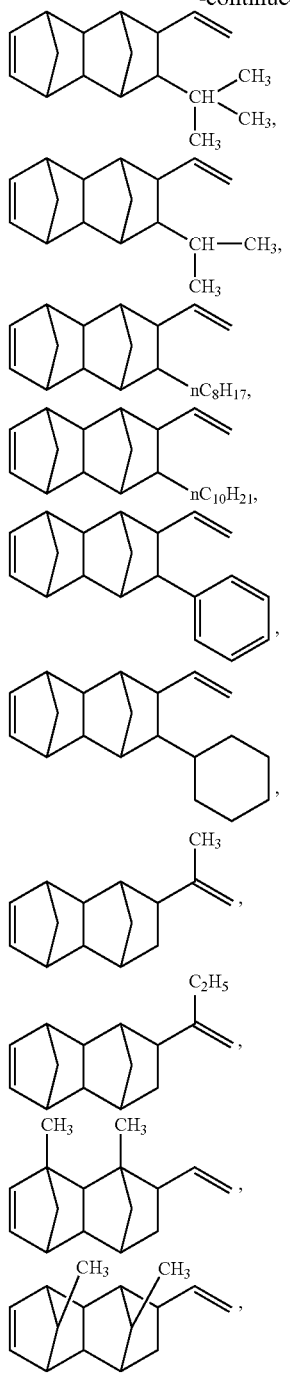

and combinations thereof.

6. The adhesive composition of claim 1, wherein based on the total moles of the repeating units (B-1), (B-2) and (B-3), the content of the repeating unit (B-2) is about 20 mol % to 33 mol %.

7. The adhesive composition of claim 1, wherein the weight ratio of the olefin copolymer (B) to the unsaturated monomer (A) is about 3.3 to 15.

8. The adhesive composition of claim 1, further comprising a silane coupling agent (C).

9. The adhesive composition of claim 8, wherein the silane coupling agent (C) is selected from the group consisting of N-(2-aminoethyl)-3-aminopropyl trimethoxy silane, N-phenyl-3-aminopropyl trimethoxy silane, 3-methacryloxy propyl trimethoxy silane, 4-epoxypropyl butyl trimethoxy silane, vinyl trimethoxy silane, vinyl phenyl trimethoxy silane, 3-mercaptopropyl methyl dimethoxy silane, 3-mercaptopropyl trimethoxy silane, and combinations thereof.

10. The adhesive composition of claim 8, wherein based on 100 parts by weight of the adhesive composition, the amount of the silane coupling agent (C) is about 0.1 parts by weight to 2 parts by weight.

11. A laminate, comprising:
 a conductive layer;
 a dielectric layer; and
 an adhesive layer disposed between the conductive layer and the dielectric layer for adhering the conductive layer to the dielectric layer,
 wherein the adhesive layer is prepared from the adhesive composition of claim 1.

12. The laminate of claim 11, wherein the weight of the adhesive layer is about 2 g/m$^2$ to 18 g/m$^2$.

13. The laminate of claim 11, wherein the conductive layer is a copper foil.

14. The laminate of claim 13, wherein the roughness (Rz) of the copper foil is 2 μm or less.

15. The laminate of claim 11, wherein the dielectric layer is prepared from one or more prepregs, wherein the one or more prepregs each comprises a curable resin and a reinforcing material.

16. The laminate of claim 15, wherein the curable resin is selected from the group consisting of polyphenylene ether resins, epoxy resins, phenolic resins, polyformaldehyde resins, silicones, polytetrafluoroethylene, and combinations thereof.

17. The laminate of claim 11, wherein the dielectric layer is prepared from one or more curable resins selected from the group consisting of polyphenylene ether resins, epoxy resins, phenolic resins, polyformaldehyde resins, silicones, polytetrafluoroethylene, and combinations thereof.

18. The laminate of claim 17, wherein the dielectric layer is prepared from a curable resin comprising a polyphenylene ether resin.

19. A method of preparing a laminate, comprising:
 providing a conductive layer and a dielectric layer; and
 providing an adhesive layer between the conductive layer and the dielectric layer for adhering the conductive layer to the dielectric layer,
 wherein the adhesive layer is prepared from the adhesive composition of claim 1.

20. A printed circuit board, which is prepared from the laminate of claim 11.

* * * * *